United States Patent [19]

Sakai

[11] Patent Number: 5,028,880
[45] Date of Patent: Jul. 2, 1991

[54] MICROWAVE POWER AMPLIFIER USING PHASE INVERTERS

[75] Inventor: Fuminori Sakai, Yokohama, Japan
[73] Assignee: Fujitsu Limited, Kawasaki, Japan
[21] Appl. No.: 480,067
[22] Filed: Feb. 14, 1990
[30] Foreign Application Priority Data
Feb. 15, 1989 [JP] Japan .................................. 1-35480
[51] Int. Cl.$^5$ .............................................. H03F 3/68
[52] U.S. Cl. ........................................ 330/84; 330/52; 330/85; 330/124 R; 330/295; 333/120
[58] Field of Search ............... 330/84, 53, 122, 124 R, 330/85, 271, 275, 295; 333/120, 161

[56] References Cited

U.S. PATENT DOCUMENTS 3,909,742  9/1975  Cox et al. ............................... 330/84

FOREIGN PATENT DOCUMENTS

2435708  2/1975  Fed. Rep. of Germany ........ 330/84
466606  7/1975  U.S.S.R. ................................. 330/53

Primary Examiner—James B. Mullins
Attorney, Agent, or Firm—Staas & Halsey

[57] ABSTRACT

A microwave power amplifier includes first and second circuits each having first, second, third and fourth terminals. Each of the first and second circuits has functions of distributing an input signal to the second and third terminals and generating first and second output signals 180° out of phase with each other through the second and third terminals, respectively, adding a first pair of 180° out-of-phase input signals to the second and third terminals and outputting a first resultant signal through the first terminal, and adding a second pair of in-phase input signals to the second and third terminals and outputting a second resultant signal through the fourth terminal. The microwave power amplifier further includes a first amplifier circuit connected between the second terminal of the first circuit and the third terminal of the second circuit, a second amplifier circuit connected between the third terminal of the first circuit and the second terminal of the second circuit, and a feedback circuit connected between the fourth terminal of the first circuit and the first terminal of the second circuit. The first terminal of the first circuit serves as an input terminal of the microwave power amplifier, and the fourth terminal of the second circuit serves as an output terminal of the microwave power amplifier.

18 Claims, 8 Drawing Sheets

MICROWAVE POWER AMPLIFIER USING PHASE INVERTERS

BACKGROUND OF THE INVENTION

The present invention generally relates to a microwave power amplifier using phase inverters, and more particularly to a microwave power amplifier such that a microwave input signal is distributed to unit amplifiers and output signals supplied therefrom are combined.

Recently, there has been considerable activity in the development of a microwave range high-output amplifier of the solid-state type. Generally, an input signal is distributed to unit amplifiers, the outputs of which are combined.

Figure 1A:
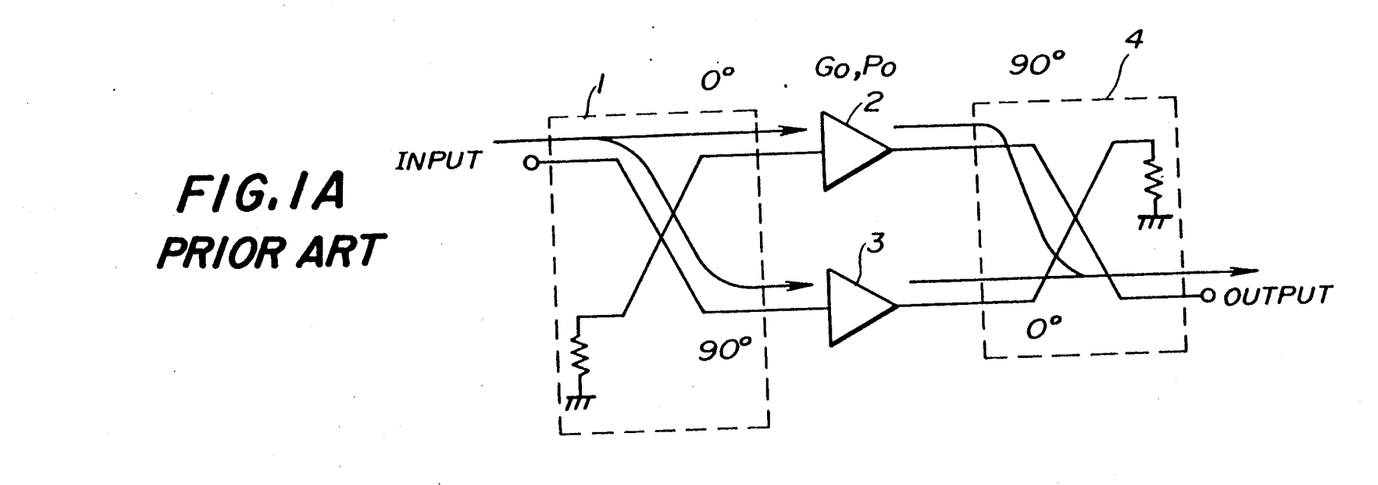
FIG. 1A is a diagram of a conventional microwave power amplifier.

Referring to FIG. 1A, there is illustrated a conventional microwave power amplifier. An input signal in the microwave range is applied to a directional coupler 1 having a distribution loss of 3 dB and causing a 90° phase difference between two output signals. One of the two output signals from the directional coupler 1 is in phase with the input signal, and the other output signal is 90° out of phase. The two 90° out-of-phase output signals from the directional coupler 1 are respectively applied to unit amplifiers 2 and 3. Output signals from the amplifiers 2 and 3 are combined by a directional coupler 4, which generates an amplified output signal. When the input signal is reflected by the amplifiers 2 or 3, a reflected signal component is absorbed by a terminal resistor provided in each of the directional couplers 1 and 4. Thus, the return loss is small.

Figure 1B:
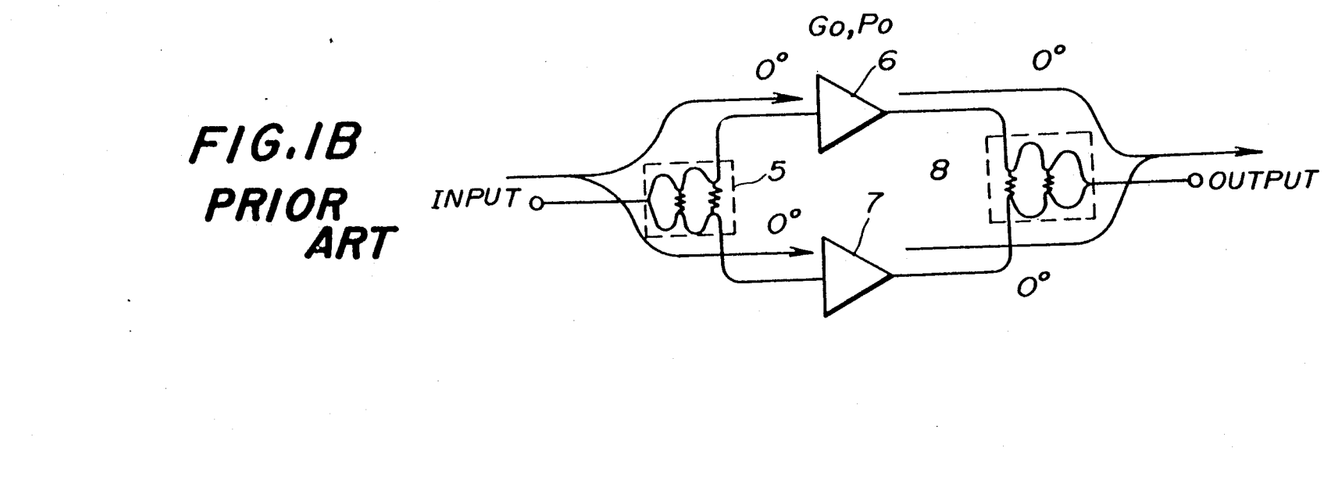
FIG. 1B is a diagram of another conventional microwave power amplifier.

FIG. 1B illustrates another conventional microwave power amplifier of the Wilkinson type. An input signal is divided into two in-phase signals by a Wilkinson type power divider 5. The two signals from the power divider 5 are individually amplified by unit amplifiers 6 and 7. The output signals from the unit amplifiers 6 and 7 are combined by a Wilkinson type power divider 8 which generates an amplified output signal.

Figure 2:
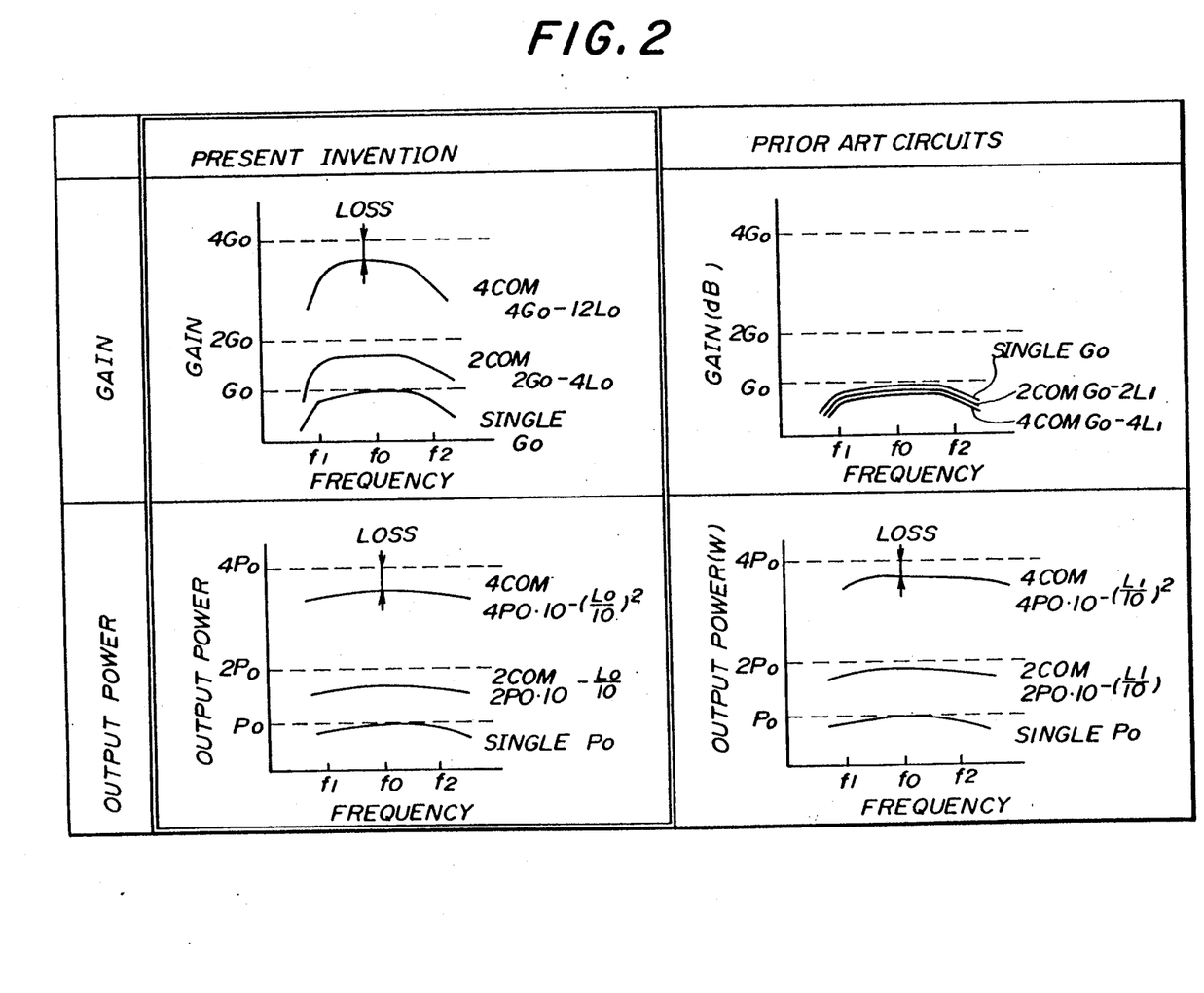
FIG. 2 includes various graphs of characteristics of conventional microwave power amplifiers and microwave power amplifiers according to embodiments of the present invention.

It is assumed that output power of each of the unit amplifiers 2, 3, 6 and 7 is represented by P0 (Watt). An insertion loss generated in each of the elements 1, 4, 5 and 8 when a signal passes therethrough once is represented by L1 (dB). In this case, the output power of each of the configurations shown in FIGS. 1A and 1B is $2P0 \cdot 10^{-(L1/10)}$ (W). The output power of an extended configuration such that a circuit identical to the circuit shown in FIG. 1A or 1B is connected in parallel thereto, is $4P0 \cdot 10^{-(L1/10)2}$ (W). FIG. 2 illustrates output power characteristics of the above-mentioned configurations. FIG. 2 also illustrates the output voltage characteristic of a simplified configuration in which a single unit amplifier is used. The output power of this configuration is P0 (W).

However, the conventional microwave power amplifiers shown in FIGS. 1A and 1B have a disadvantage in that a large power loss occurs in each of the elements 1, 4, 5 and 8. The gain of each of the configurations shown in FIGS. 1A and 1B is G0−2L1 (dB) where G0 (dB) is the gain of each of the unit amplifiers 2, 3, 6 and 7. Further, the gain of the aforementioned extended configuration is G0−4L1 (dB), and the gain of the aforementioned simplified configuration is G0 (dB). FIG. 2 also illustrates gain characteristics of the individual configurations. It can be seen from the graph of FIG. 2 that the gain of each conventional configuration is decreased by the loss generated in the directional couplers 1 and 4 or the power dividers 5 and 8. Further, it can be seen from the graph of FIG. 2 that the loss of gain decreases with an increase in the number of signals to be distributed and combined.

SUMMARY OF THE INVENTION

It is a general object of the present invention to provide an improved microwave power amplifier in which the above-mentioned disadvantages are overcome.

A more specific object of the present invention is to provide a microwave power amplifier having an increased gain with high efficiency.

The above-mentioned objects of the present invention are achieved by a microwave power amplifier which includes first and second circuits each having first, second, third and fourth terminals. Each of the first and second circuits has the functions of distributing an input signal to the second and third terminals and generating first and second output signals 180° out of phase with each other through the second and third terminals, respectively, adding a first pair of 180° out-of-phase input signals applied to the second and third signals and outputting a first resultant signal through the first terminal, and adding a second pair of in-phase input signals applied to the second and third signals and outputting a second resultant signal through the fourth terminal. The microwave power amplifier further includes a first amplifier circuit connected between the second terminal of the first circuit and the third terminal of the second circuit, a second amplifier circuit connected between the third terminal of the first circuit and the second terminal of the second circuit, and a feedback circuit connected between the fourth terminal of the first circuit and the first terminal of the second circuit. The first terminal of the first circuit serves as an input terminal of the microwave power amplifier, and the fourth terminal of the second circuit serves an output terminal of the microwave power amplifier.

Further objects, features and advantages of the present invention will become apparent from the following detailed description when read in conjunction with the accompanying drawings.

DESCRIPTION OF THE PREFERRED EMBODIMENTS

Figure 3:
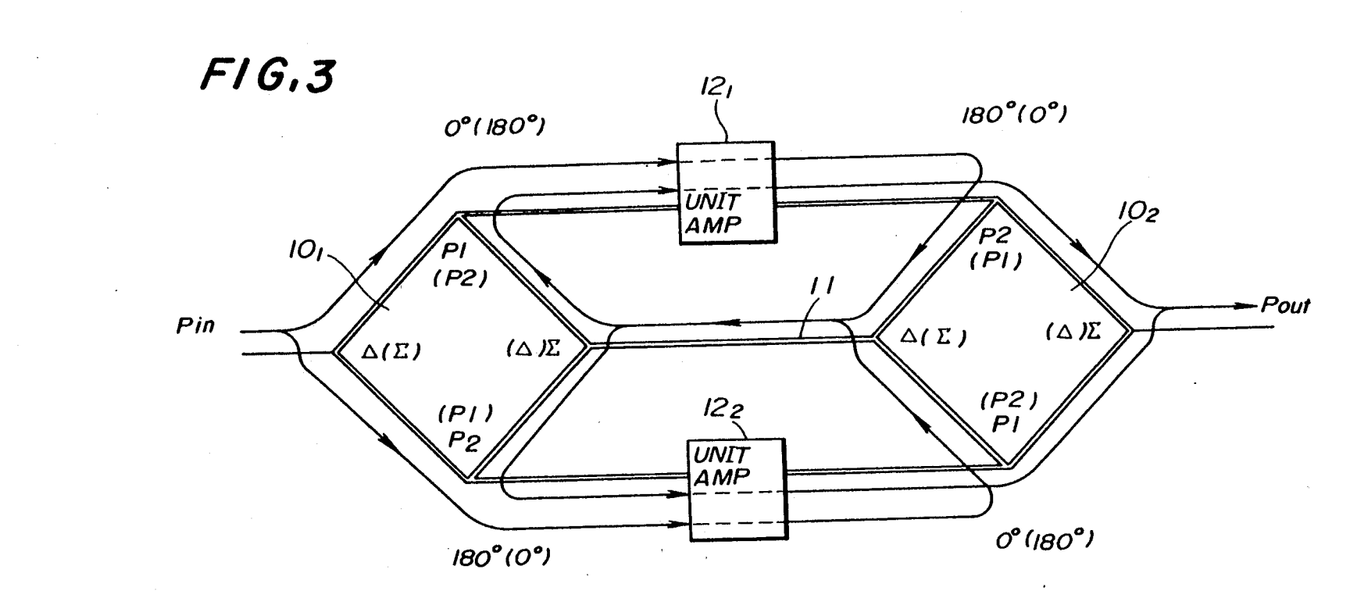
FIG. 3 is a diagram of a microwave power amplifier according to a first preferred embodiment of the present invention.

A description is given of a first preferred embodiment of the present invention with reference to FIG. 3. The microwave power amplifier according to the first embodiment of the present invention includes two four-terminal circuits $10_1$ and $10_2$, two unit amplifiers $12_1$ and $12_2$, and a feedback circuit 11. The four-terminal circuit $10_1$ has four terminals P1, P2, $\Delta$ and $\Sigma$. An input signal Pin is applied to the terminal $\Delta$ and output signals are drawn from the terminals P1 and P2. There is a $+90°$ phase difference between the terminals $\Delta$ and P1 and $-90°$ phase difference between the terminals $\Delta$ and P2. Thus, there is a 180° phase difference between the terminals P1 and P2, and the signals drawn therefrom are 180° out of phase. The output signal from the terminal P1 is amplified by the unit amplifier $12_1$ and applied to a terminal P2 of the four-terminal circuit $10_2$. Similarly, the output signal from the terminal P2 of the four-terminal circuit $10_1$ is amplified by the unit amplifier $12_2$ and applied to a terminal P1 of the four-terminal circuit $10_2$. The signals applied to the terminals P1 and P2 are combined in phase with each other and are drawn from a terminal $\Delta$ thereof. A resultant or feedback signal drawn from the terminal $\Delta$ of the four-terminal circuit $10_2$ passes through the feedback circuit 11, and is then applied to the terminal $\Sigma$ of the four-terminal circuit $10_1$. The feedback signal applied to the terminal $\Sigma$ is distributed to the terminals P1 and P2, from which output signals in phase with each other are drawn. Then the signals drawn from the terminals P1 and P2 of the four-terminal circuit $10_1$ pass through the unit amplifiers $12_1$ and $12_2$ and are then applied again to the terminals P2 and P1 of the four-terminal circuit $10_2$, respectively. The signals applied to the terminals P2 and P1 of the four-terminal circuit $10_2$ are combined in phase with each other so that an output signal Pout is drawn from a terminal $\Sigma$ thereof. It is noted that the input signal Pin passes through each of the unit amplifiers $12_1$ and $12_2$ two times. Thus, the gain of the microwave power amplifier shown in FIG. 3 is approximately twice the gain of the conventional microwave power amplifier shown in FIG. 1A or FIG. 1B.

Figure 4:
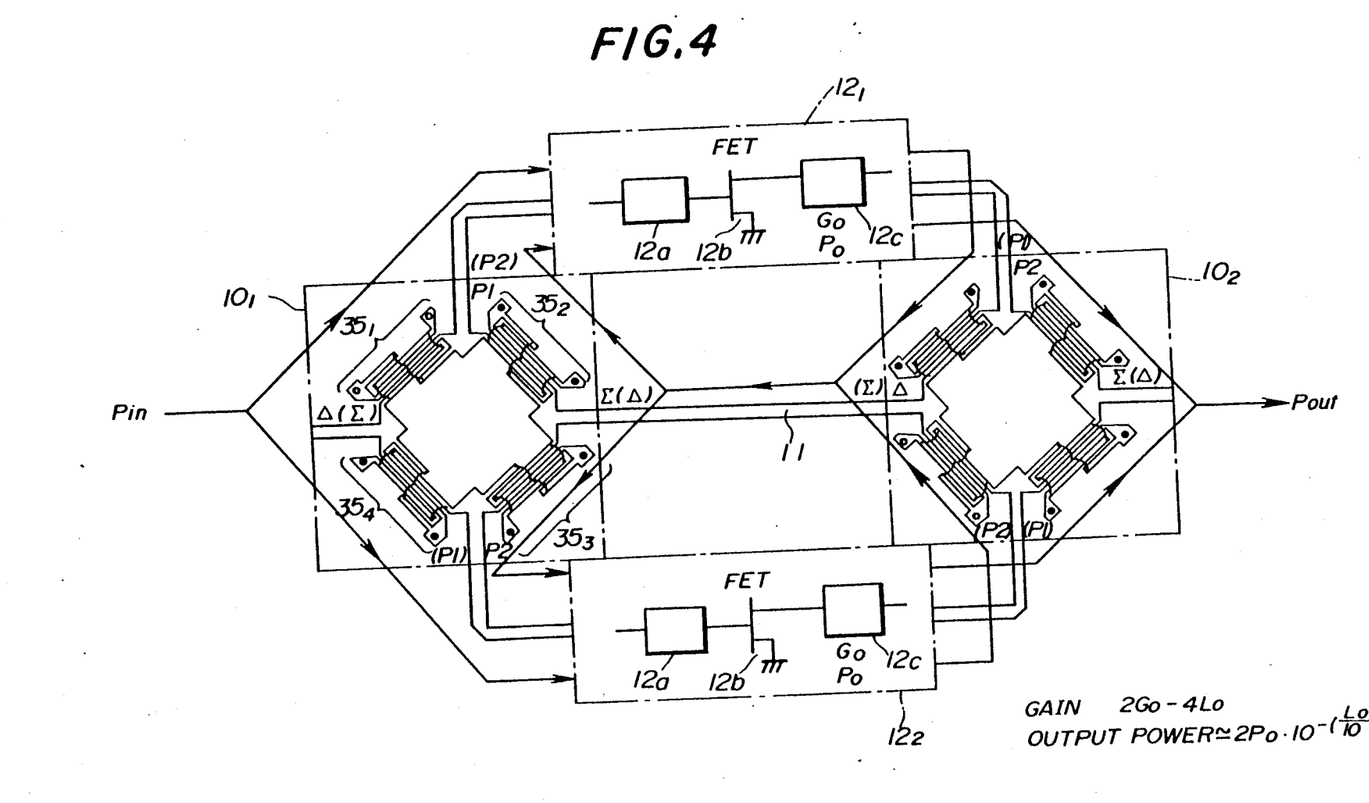
FIG. 4 is a diagram of a more detailed configuration of the amplifier shown in FIG. 3.

FIG. 4 is a block diagram of a more detailed configuration of the microwave power amplifier shown in FIG. 3. In FIG. 4, "○" indicates and open end of a transmission line, and "●" indicates a grounded end of a transmission line. Each of the four-terminal circuits $10_1$ and $10_2$ is formed by a phase inverter, which will be described in detail later. The unit amplifier $12_1$ connected between the terminal P1 of the phase inverter $10_1$ and the terminal P2 of the phase inverter $10_2$ is composed of an input matching circuit 12a, a field effect transistor (FET) 12b and an output matching circuit 12c in the same way as a conventional unit amplifier. The unit amplifier $12_2$ connected between the terminal P2 of the phase inverter $10_1$ and the terminal P1 of the phase inverter $10_2$ is configured in the same way as the unit amplifier $12_1$. The unit amplifier $12_1$ and $12_2$ are adjusted so as to present the same gain characteristic and the same phase variation characteristic. It is noted that there is a possibility that the configuration may oscillate when there are differences in characteristics between the unit amplifiers $12_1$ and $12_2$. The feedback circuit 11 connected between the terminal $\Sigma$ of the phase inverter $10_1$ and the terminal $\Delta$ of the phase inverter $10_2$ is formed by a transmission line.

Figure 5A:
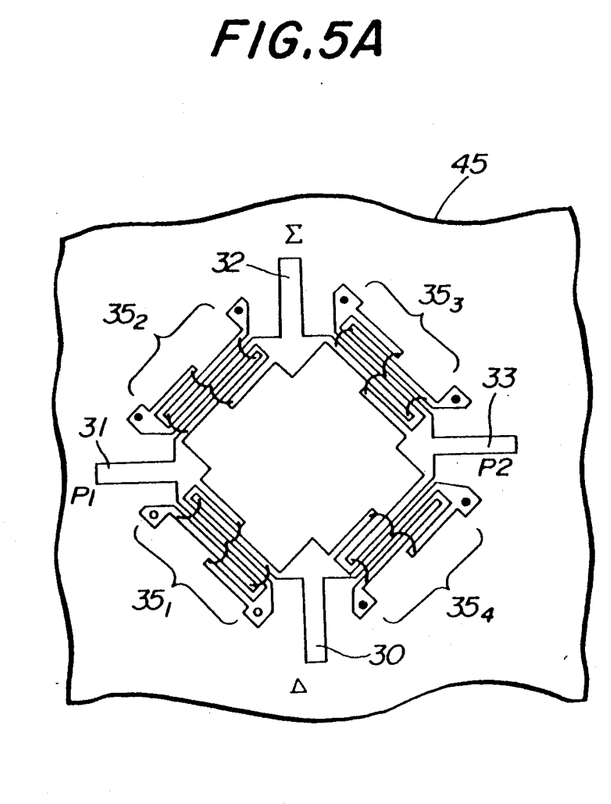
FIGS. 5A and 5B are plan views of phase inverters which are applied to the present invention.

FIG. 5A is a diagram of a more detailed configuration of each of the phase inverters $10_1$ and $10_2$ shown in FIG. 4. The illustrated configuration is proposed in a copending U.S. patent application Ser. No. 07/466,751, filed Jan. 1, 1990, the disclosure of which is hereby incorporated by reference. The phase inverter is made up of four directional couplers which are networks each composed of parallel coupled lines. Networks (directional couplers) $35_1$, $35_2$, $35_3$ and $35_4$ are of the ring coupler type and are arranged into a ring on a dielectric substrate 45. Terminals 30, 31, 32 and 33 corresponding to the aforementioned terminals $\Delta$, P1, $\Sigma$ and P2 respectively, are provided between adjacent directional couplers among the directional couplers $35_1$–$35_4$.

Figure 6:
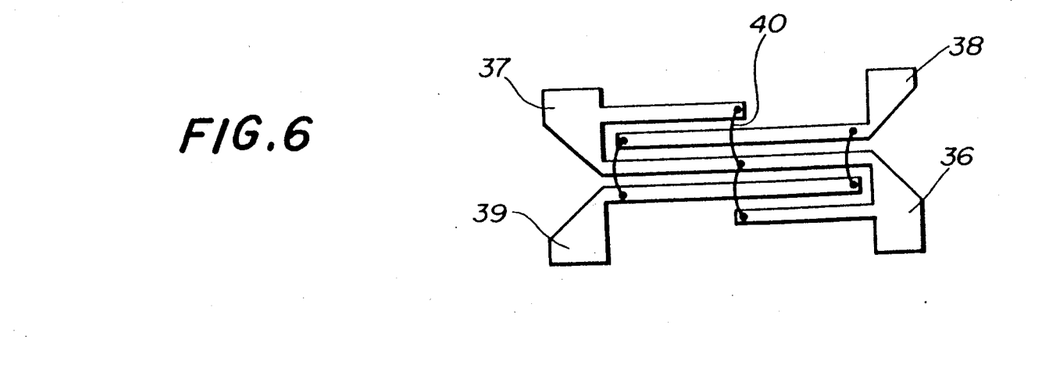
FIG. 6 is a plan view of a directional coupler used in the phase inverters shown in FIGS. 5A and 5B.

As shown in FIG. 6, each of the directional couplers $35_1$–$35_4$ has a plurality of comb-shaped interdigital transmission lines. The transmission lines are electrically coupled to each other for every other transmission line through conductive jump wires 40. The directional coupler has four terminals 36, 37, 38 and 39. In a directional coupler of the open type, the terminal 39 (couple port) and the terminal 36 (main port) are both open. In a directional coupler of the grounded type, the terminals 36 and 39 are both grounded. In the open type directional coupler, there is a 90° phase difference between the terminal 37 (input port) and the terminal 38 (isolation port) at a center frequency $f_0$. In the grounded type directional coupler, there is a $-90°$ phase difference between terminals 37 and 38 at the center frequency $f_0$. The directional coupler shown in FIG. 6 itself is known to a person having an ordinary skill in the art.

Turning to FIG. 5A, three directional couplers $35_2$, $35_3$ and $35_4$ are respectively provided between the terminals 31 and 32, 32 and 33, and 33 and 30 and are of the grounded type. The remaining directional coupler $35_1$ provided between the terminals 30 and 31 is of the open type. When an input signal is applied to the terminal 30, 180° out-of-phase signals are drawn from the output terminals 31 and 33. Particularly at the center frequency $f_0$, there is a $+90°$ phase difference between a terminals 30 and 31, and the $-90°$ phase difference between the terminals 30 and 33.

Figure 5B:
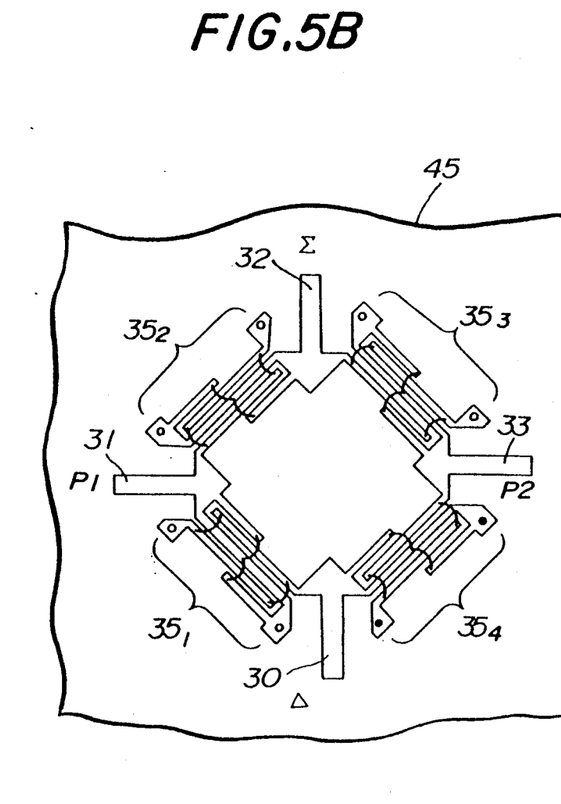

Referring to FIG. 5B, the directional couplers $35_1$, $35_2$ and $35_3$ are respectively provided between the terminals 30 and 31, 31 and 32, and 32 and 33 and are of the open type. The directional coupler $35_4$ provided between the terminals 30 and 33 is of the grounded type. When an input signal is applied to the input terminal 30, 180° out-of-phase signals are drawn from the output terminals 31 and 33. Particularly, at the center frequency $f_0$, there is a $+90°$ phase difference between the terminals 30 and 31, and a $-90°$ difference between the terminals 30 and 33.

As described previously, the transmission lines are formed by conductive patterns arranged on the dielectric substrate 45. That is, the transmission lines have a microstrip structure. Alternatively, the transmission lines are formed by copalaner waveguides, waveguides or strip lines.

Turning to FIG. 4, each of the phase inverters $10_1$ and $10_2$ has the same arrangement as the phase inverter shown in FIG. 5A. As described previously, the directional coupler $35_1$ between the terminals $\Delta$ and the terminal P1 is of the open type, and the other directional couplers $35_2$, $35_3$ and $35_4$ are of the grounded type. When an input signal is applied to the terminal $\Delta$, 180° out-of-phase output signals are drawn from the terminals P1 and P2. When an input signal is applied to the terminal $\Sigma$, output signals in phase with each other are drawn from the terminals P1 and P2. When two input signals in phase with each other are respectively applied to the terminals P1 and P2, a resultant output signal is drawn from the terminal $\Sigma$. When two 180° out-of-phase input signals are applied to the terminals P1 and P2, a resultant output signal is drawn from the terminal $\Delta$. The above-mentioned operation of each of the phase inverter $10_1$ and $10_2$ is shown in Table 1.

TABLE 1

| Input (output) terminal | Output (input) terminals P1, P2 |
|---|---|
| $\Delta$ | 180° out of phase |
| $\Sigma$ | in phase |

The input signal Pin applied to the terminal $\Delta$ is distributed to the terminals P1 and P2, from which the 180° out-of-phase output signals are drawn. The output signals from the terminals P1 and P2 are amplified by the unit amplifiers $12_1$ and $12_2$, and then applied to the terminals P2 and P1 of the phase inverter $10_2$, respectively. Then the signals applied to the terminals P2 and P1 of the phase inverter $10_2$ are combined in 180° out-of-phase with each other and the resultant signal is drawn from the terminal $\Delta$ thereof. The resultant signal or feedback signal passes through the feedback circuit 11 and is then applied to the terminal $\Sigma$ of the phase inverter $10_1$, which outputs the signals in phase with each other from the terminals P1 and P2 thereof. The output signals from the terminals P1 and P2 pass through the unit amplifiers $12_1$ and $12_2$ and are then applied to the terminals P2 and P1 of the phase inverter $10_2$, respectively. The phase inverter $10_2$ adds the signals applied to the terminals P2 and P1 and generates the output signal through the terminal $\Sigma$ thereof.

As indicated by the arrows in FIG. 4, the input signal Pin passes through each of the unit amplifiers $12_1$ and $12_2$ twice. The gain of the microwave power amplifier shown in FIG. 4 is 2G0−4L0 (dB) where L0 (dB) is a loss caused in each of the phase inverters $10_1$ and $10_2$ obtained when the signal passes therethrough once, and G0 is the gain (dB) of each of the unit amplifiers $12_1$ and $12_2$. Thus, the gain of the microwave power amplifier shown in FIG. 4 is approximately twice the gain of the conventional configuration in which the input signal passes through the unit amplifier only once. The output power (W) of the microwave power amplifier shown in FIG. 4 is $2P0 \cdot 10^{-(L0/10)}$ (W) where P0 is the output power of each of the unit amplifiers $12_1$ and $12_2$. Thus, the output power of the configuration shown in FIG. 4 is approximately equal to that of the configuration shown in FIG. 1A or FIG. 1B.

Alternatively, it is possible to modify the terminal arrangement shown in FIG. 3 as indicated by the parentheses shown in FIG. 3. In the alternative, the input signal Pin applied to the terminal ($\Sigma$) is distributed to the terminals (P2) and (P1) in phase and then amplified by the unit amplifiers $12_1$ and $12_2$, respectively. The signals from the unit amplifiers $12_1$ and $12_2$ are applied to the terminals (P1) and (P2) of the phase inverter $10_2$, and then output through the terminal ($\Sigma$) in phase. The resultant signal from the terminal ($\Sigma$) passes through the feedback circuit 11 and is then applied to the terminal ($\Delta$) of the phase inverter $10_1$. The signal applied to the terminal ($\Delta$) of the phase inverter $10_1$ is distributed to the terminals (P2) and (P1), from which 180° out-of-phase signals are drawn. The signals from the terminals (P2) and (P1) pass through the unit amplifiers $12_1$ and $12_2$ and are then applied to the terminals (P1) and (P2) of the phase inverter $10_2$, respectively. Then a resultant output signal is drawn from the terminal ($\Delta$) of the phase inverter $10_2$.

Figure 7:
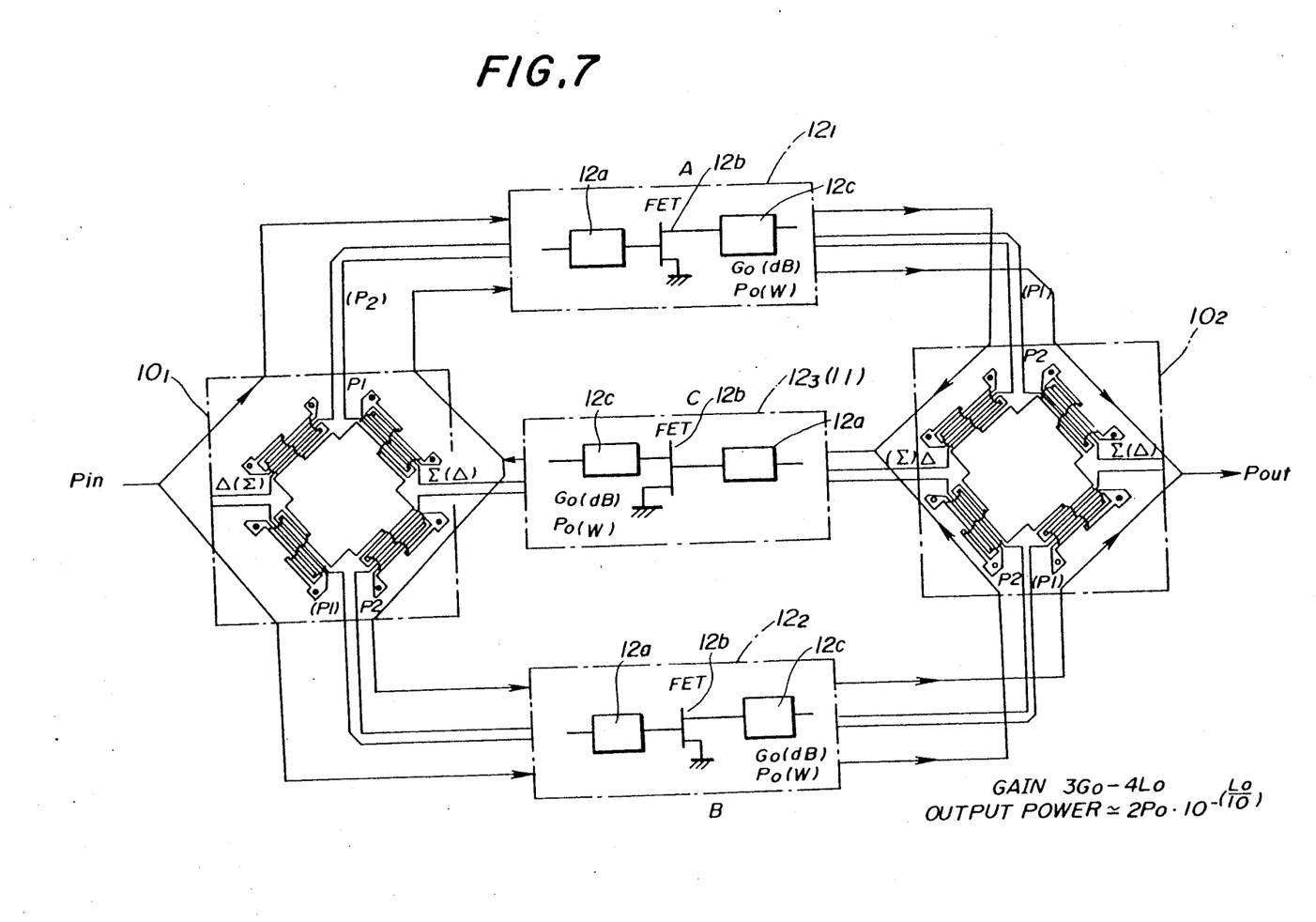
FIG. 7 is a diagram of a variation of the microwave power amplifier shown in FIG. 3.

FIG. 7 is a bock circuit diagram of a variation of the circuit shown in FIG. 4. In FIG. 7, those parts which are the same as those shown in the previous figures are given the same reference numerals. The transmission line 11 forming the feedback circuit shown in FIG. 4 is replaced by a unit amplifier $12_3$. That is, an input terminal of the unit amplifier $12_3$ is connected to the terminal $\Delta$ of the phase inverter $10_2$, and an output terminal thereof is connected to the terminal $\Sigma$ of the phase inverter $10_1$ The unit amplifier $12_3$ is composed of an input matching circuit 12a, an FET 12b and an output matching circuit 12c in the same way as each of the unit amplifiers $12_1$ and $12_2$. It is not necessary for the unit amplifier $12_3$ to have the same characteristic as each of the unit amplifiers $12_1$ and $12_2$. By using the unit amplifier $12_3$, the output power of the microwave power amplifier becomes closer to 2P0. The feedback signal from the phase inverter $10_2$ is amplified by the unit amplifier $12_3$. Thus, it becomes possible to obtain a larger level difference between the first and second signals applied to each of the unit amplifiers $12_1$ and $12_2$ Thus, the output power obtained when the input signal is first supplied to each unit amplifier $12_1$ and $12_2$ becomes considerably smaller than that obtained when the input signal is supplied thereto for the second time.

Figure 8:
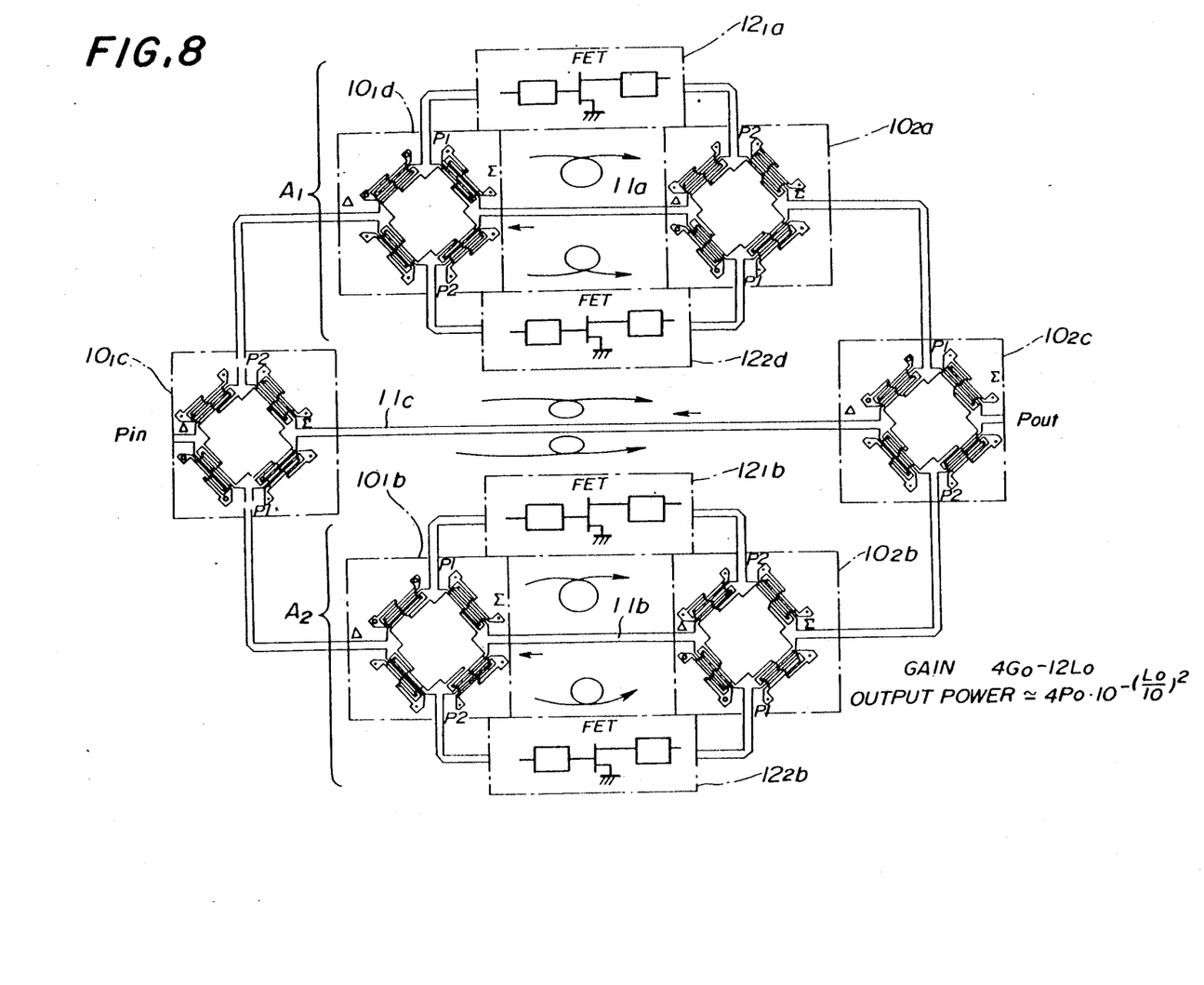
FIG. 8 is a diagram of a microwave power amplifier according to a second preferred embodiment of the present invention.

A description is given of a second preferred embodiment of the present invention with reference to FIG. 8. The second embodiment of the present invention is composed of two phase inverters $10_{1c}$ and $10_{2c}$, two unit amplifiers A1 and A2, and the feedback circuit 11 formed by a transmission line. Each of the unit amplifiers A1 and A2 has the same configuration as the amplifier shown in FIG. 4.

The unit amplifier A1 is composed of two phase inverters $10_{1a}$ and $10_{2a}$, two unit amplifiers $12_{1a}$ and $12_{2a}$, and a feedback transmission line 11a. Similarly, the unit amplifier A2 is composed of two phase inverters $10_{1b}$ and $10_{2b}$, two unit amplifiers $12_{1b}$ and $12_{2b}$ and a feedback transmission line 11b. The terminal P2 of the phase inverter $10_{1c}$ is connected to the terminal $\Delta$ of the phase inverter $10_{1a}$, and the terminal P1 of the phase inverter $10_{1c}$ is connected to the terminal $\Delta$ of the phase inverter $10_{1b}$. The terminal P1 of the phase inverter $10_{2c}$ is connected to the terminal $\Sigma$ of the phase inverter $10_{2a}$, and the terminal P2 of the phase inverter $10_{2c}$ is connected to the terminal $\Sigma$ of the phase inverter $10_{2b}$.

The second embodiment of the present invention shown in FIG. 8 corresponds to the combination of two amplifiers, each of which is the same as that shown in FIG. 4. Thus, the gain of the amplifier shown in FIG. 8 is 4G0−12L0 (dB), which is approximately four times as large as the gain of the conventional amplifier, G0−4L1 (dB). On the other hand, the output power of the amplifier shown in FIG. 8 is $4P0 \cdot 10^{-(L0/10)2}$(W), which is almost equal to that of the conventional amplifier.

Figure 9A:
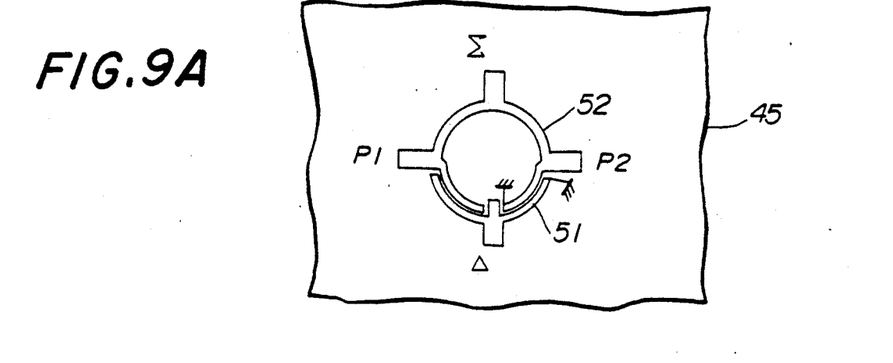
FIGS. 9A through 9C are plan views of alternative phase inverts.
Figure 9B:
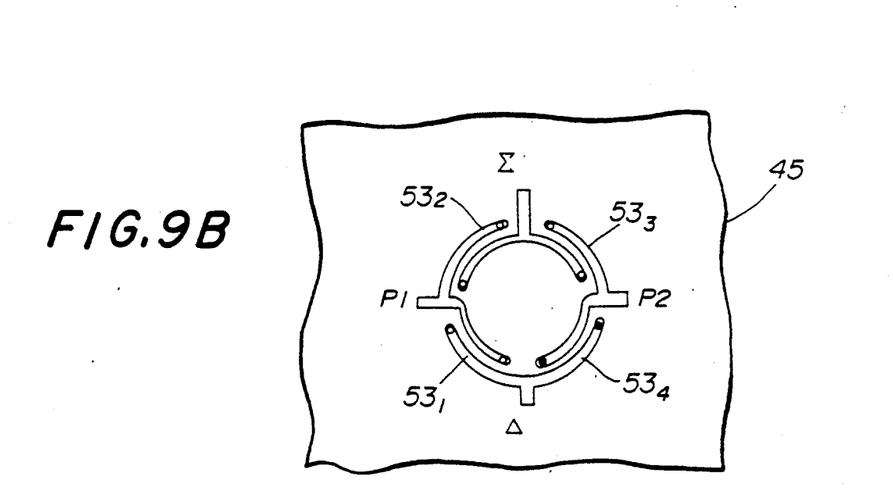
Figure 9C:
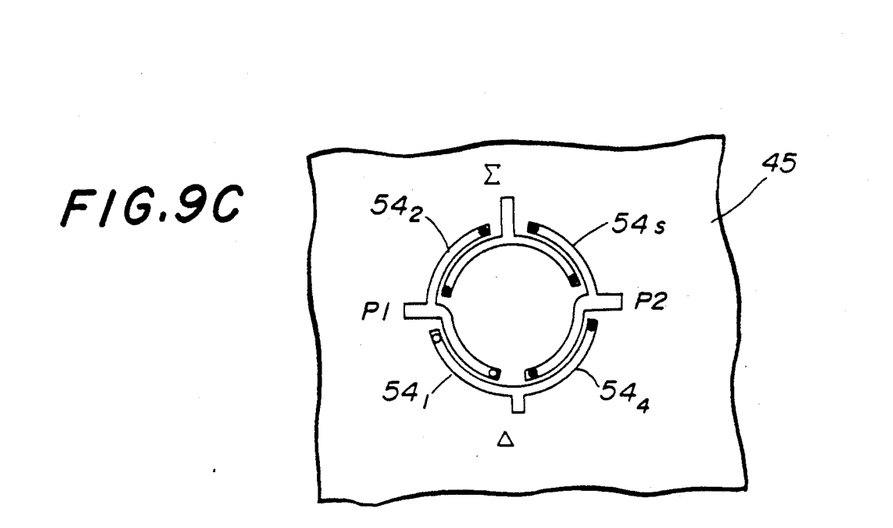

Each of the aforementioned phase inverters may be replaced by a phase inverter shown in FIGS. 9A, 9B or 9C. The phase inverter shown in FIG. 9A is composed of a transmission line 51 having a terminal $\Delta$ and a transmission line 52 having terminals $\Sigma$, P1 and P2. Two coupling circuits are formed, one of which is coupled between the terminals $\Delta$ and P1, and the other which is coupled between the terminals $\Delta$ and P2. The phase inverter shown in FIG. 9B is composed of four networks (directional couplers) $53_1$, $53_2$, $53_3$ and $53_4$. The network $53_4$ between the terminals $\Delta$ and P2 is of the grounded type, and the other networks are of the open type. The phase inverter shown in FIG. 9C is composed of four networks $54_1$, $54_2$, $54_3$ and $54_4$. The network $54_1$ between the terminals $\Delta$ and P1 is of the open type, and the other networks are of the grounded type. Alternatively, each of the four-terminal circuit $10_1$ and $10_2$ may be formed by a magic T or a rat race. Alternatively, the transmission line of the feedback circuit 11c is replaced by a unit amplifier such as shown in FIG. 7.

Each of the unit amplifiers $12_1$, $12_2$ and $12_3$ is not limited to the aforementioned single-end amplifier using an FET. It is possible to use the configuration shown in FIG. 1A or 1B. Alternatively, it is possible to configure the unit amplifier using a conventional push-pull amplifier. A filter or a phase shifter may be used for forming the aforementioned feedback circuit 11, 11a or 11b.

The present invention is not limited to the specifically described embodiments, and variations and modifications may be made without departing from the scope of the present invention.

What is claimed is:

1. A microwave power amplifier comprising:
    first and second means each having first, second, third and fourth terminals for distributing an input signal to said second and third terminals and generating first and second output signals 180° out-of-phase with each other through said second and third terminals, respectively, for adding a first pair of 180° out-of-phase input signals applied to said second and third terminals and outputting a first resultant signal through said first terminal, and for adding a second pair of in-phase input signals applied to said second and third terminals and outputting a second resultant signal through said fourth terminal;
    a first amplifier circuit connected between said second terminal of said first means and said third terminal of said second means;
    a second amplifier circuit connected between said third terminal of said first means and said second terminal of said second means; and
    a feedback circuit connected between said fourth terminal of said first means and said first terminal of said second means, said feedback circuit transmitting a signal between said fourth terminal of said first means and said second terminal of said second means without substantially attenuating said signal,
    said first terminal of said first means serving as an input terminal of said microwave power amplifier, and said fourth terminal of said second means serving as an output terminal of said microwave power amplifier, and
    said microwave power amplifier having a gain and output power greater than a gain and output power of each of said first and second amplifier circuits.

2. A microwave power amplifier as claimed in claim 1, wherein each of said first and second means comprises a phase inverter.

3. A microwave power amplifier as claimed in claim 1, wherein each of said first and second means comprises:
    a first coupling circuit coupled between said first terminal and said second terminal;
    a second coupling circuit coupled between said first terminal and said third terminal;
    a third coupling circuit coupled between said second terminal and said fourth terminal; and
    a fourth coupling circuit coupled between said third terminal and said fourth terminal,
    wherein each of said first through fourth coupling circuits has a substantially identical length and has two ends, a type of each of said first through fourth coupling circuits being defined on the basis of whether said two ends are grounded or open.

4. A microwave power amplifier as claimed in claim 3, wherein said first coupling circuit has two ends which are both open, wherein said second coupling circuit has two ends which are both grounded, and wherein said third and fourth coupling circuits have ends of a type identical to ends of said second coupling circuit.

5. A microwave power amplifier as claimed in claim 3, wherein said first coupling circuit has two ends which are both open, wherein said second coupling circuit has two ends which are both grounded, and wherein said third and fourth coupling circuits have ends of a type identical to ends of said first coupling circuit.

6. A microwave power amplifier as claimed in claim 3, wherein each of said first, second, third and fourth coupling circuits comprises a directional coupler.

7. A microwave power amplifier as claimed in claim 3, wherein each of said first, second, third and fourth coupling circuits comprises comb-shaped interdigital transmission lines.

8. A microwave power amplifier as claimed in claim 1, wherein each of said first and second means comprises:
    a first transmission line having said first terminal; and
    a second transmission line having said second, third and fourth terminals,
    said first and second transmission liens forming a first coupling circuit coupled between said first and second terminals and a second coupling circuit coupled between said first and third terminals,
    each of said first and second coupling circuits having a substantially identical length and having two ends, a type of each of said first and second coupling circuits being defined on the basis of whether said two ends are grounded or open, and
    said first coupling circuit has an end type which is different from that of said second coupling circuit.

9. A microwave power amplifier as claimed in claim 1, wherein each of said first and second amplifier circuits comprises a unit amplifier.

10. A microwave power amplifier as claimed in claim 1, wherein said feedback circuit comprises a transmission line.

11. A microwave power amplifier as claimed in claim 1, wherein said feedback circuit comprises an amplifier.

12. A microwave power amplifier as claimed in claim 1, wherein each of said first and second amplifier circuits comprises:
    first and second phase inverting means each having first, second, third and fourth terminals for distributing an input signal to said second and third terminals and generating first and second output signals 180° out-of-phase with each other through said second and third terminals, respectively, for adding a first pair of 180° out-of-phase input signals applied to said second and third terminals and outputting a first resultant signal through said first terminal, and for adding a second pair of in-phase input signals applied to said second and third terminals and outputting a second resultant signal to said fourth terminal;

a first amplifier connected between said second terminal of said first phase inverting means and said third terminal of said second phase inverting means;

a second amplifier connected between said third terminal of said first phase inverting means and said second terminal of said second phase inverting means; and a signal feedback circuit connected between said fourth terminal of said first phase inverting means and said first terminal of said second phase inverting means, and wherein:

said first terminal of said first phase inverting means of said first amplifier circuit is connected to said third terminal of said first means, and said fourth terminal of said second phase inverting means of said first amplifier circuit is connected to said second terminal of said second means, and said first terminal of said first phase inverting means of said second amplifier circuit is connected to said second terminal of said first means, and said fourth terminal of said second phase inverting means of said second amplifier is connected to said third terminal of said second means.

13. A microwave power amplifier as claimed in claim 12, wherein each of said first and second phase inverting means comprises:

a first coupling circuit coupled between said first terminal and said second terminal of each of said first and second phase inverting means;

a second coupling circuit coupled between said first terminal and said third terminal of each of said first and second phase inverting means;

a third coupling circuit coupled between said second terminal and said fourth terminal of each of said first and second phase inverting means;

a fourth coupling circuit coupled between said third terminal and said fourth terminal of each of said first and second phase inverting means;

wherein each of said first through fourth coupling circuits has a substantially identical length and having two ends, a type of each of said first through fourth coupling circuit being defined on the basis of whether said two ends are grounded or open.

14. A microwave power amplifier as claimed in claim 13, wherein said first coupling circuit of each of said first and second phase inverting means has two ends which are both open, wherein said second coupling circuit of each of said first and second phase inverting means has two ends which are both grounded, and wherein said third and fourth coupling circuits have ends of a type identical to the ends of said second coupling circuit.

15. A microwave power amplifier as claimed in claim 13, wherein said first coupling circuit of each of said first and second phase inverting means has two ends which are both open, wherein said second coupling circuit of each of said first and second phase inverting means has two ends which are both grounded, and wherein said third and fourth coupling circuits have ends of a type identical to the ends of said first coupling circuit.

16. A microwave power amplifier as claimed in claim 13, wherein each of said first, second, third and fourth coupling circuits provided in each of said first and second phase inverting means comprises a directional coupler.

17. A microwave power amplifier as claimed in claim 12, wherein said feedback circuit of each of said first and second amplifier circuits comprises a transmission line.

18. A microwave power amplifier as claimed in claim 12, wherein said feedback circuit of each of said first and second amplifier circuits comprises an amplifier.

* * * * *